United States Patent
Srinivasan et al.

(10) Patent No.: US 10,389,250 B1
(45) Date of Patent: Aug. 20, 2019

(54) OPERATING MODE FOR A DC-DC CONVERTER TO OBTAIN A BROAD RANGE OF OUTPUT VOLTAGES

(71) Applicant: Aura Semiconductor Pvt. Ltd, Bangalore (IN)

(72) Inventors: Hariharan Srinivasan, Chennai (IN); Arnold J D'Souza, Bangalore (IN); Shyam Somayajula, Bangalore (IN)

(73) Assignee: Aura Semiconductor Pvt. Ltd, Bangalore (IN)

( * ) Notice: Subject to any disclaimer, the term of this patent is extended or adjusted under 35 U.S.C. 154(b) by 0 days.

(21) Appl. No.: 16/102,739

(22) Filed: Aug. 14, 2018

Related U.S. Application Data

(60) Provisional application No. 62/658,625, filed on Apr. 17, 2018.

(30) Foreign Application Priority Data

Jun. 26, 2018 (IN) .............................. 201841023792

(51) Int. Cl.
*H02M 3/158* (2006.01)
*H02M 3/156* (2006.01)

(52) U.S. Cl.
CPC .. *H02M 3/1582* (2013.01); *H02M 2003/1566* (2013.01)

(58) Field of Classification Search
CPC ....... H02M 3/1582; H02M 2003/1566; H02M 3/158; H02M 3/1588; H02M 3/005; H02M 2003/1557
See application file for complete search history.

(56) References Cited

U.S. PATENT DOCUMENTS 8,773,084 B2 * 7/2014 Casey ................ H02M 3/1582
                                                          323/225
8,872,487 B2   10/2014 Belloni et al.
(Continued)

OTHER PUBLICATIONS

Ping-Ching Huang, et al., High efficiency and smooth transition buck-boost converter for extending battery life in portable devices, http://ieeexplore.ieee.org/abstract/document/5316448/, 2009 IEEE Energy Conversion Congress and Exposition, Date of Conference: Sep. 20-24, 2009, pp. 2869-2872, IEEE.
(Continued)

*Primary Examiner* — Adolf D Berhane
*Assistant Examiner* — Jye-June Lee
(74) *Attorney, Agent, or Firm* — IPHORIZONS PLLC; Narendra Reddy Thappeta

(57) ABSTRACT

A DC-DC converter includes an inductor, and generates a regulated voltage from a power source. The current flow through the inductor is increased at a first rate in a first interval. In a second interval, the current flow through the inductor is either increased at a second rate or decreased at a third rate depending on whether the regulated voltage is required to be respectively less than or greater than a voltage of the power source. The current flow through the inductor is decreased at a fourth rate in a third interval. The sequence formed by the first interval, the second interval and the third interval is repeated, and followed for all values of the regulated voltage from a lower threshold to higher threshold. The higher threshold has a value greater than the voltage of the power source. The lower threshold is zero volts.

20 Claims, 10 Drawing Sheets

(56) References Cited

U.S. PATENT DOCUMENTS

| | | |
|---|---|---|
| 9,385,606 B2 | 7/2016 | Bazzani et al. |
| 9,425,692 B2 | 8/2016 | Bernon-Enjalbert et al. |
| 2015/0171744 A1 | 6/2015 | Fabbro |
| 2016/0315535 A1* | 10/2016 | Ouyang .............. H02M 3/1582 |

OTHER PUBLICATIONS

Nanda Kumar.K, Giri.R, A Positive Buck-Boost Converter Controlled by Digital Combination of Buck and Boost Converters to Improve the Output Transients, International Journal of Advanced Trends in Computer Science and Engineering, date Feb. 8-9, 2013, pp. 139-148, vol. 2, ISSN 2778-3091.

Yanzhao MA. et al., A Current Mode Buck/Boost DC-DC Converter With Automatic Mode Transition and Light Load Efficiency Enhancement, IEICE Transactions on Electronic, Publication Date:Jun. 1, 2015, pp. 496-503, vol. E98-C No. 6.

M. Gaboriault, A. Notman, A high efficiency, noninverting, buck-boost DC-DC converter, Nineteenth Annual IEEE Applied Power Electronics Conference and Exposition, 2004. APEC '04., Date of Conference: Feb. 22-26, 2004, pp. 1-4.

M3668 1-A, High-Efficiency Dual-Mode Single-Inductor Buck-Boost DC-DC Converter, date Jun. 2007, pp. 1-30, Texas Instruments.

K.Vijaykaran, Mrs.J.Jeyashanthi, A Positive Buck-Boost DC-DC Converter with Mode-Select Circuit Using PID Controller, International Journal of Innovative Research in Science, Engineering and Technology, date Mar. 21 & 22, 2014, pp. 221-226, vol. 3, Special Issue 3.

* cited by examiner

OPERATING MODE FOR A DC-DC CONVERTER TO OBTAIN A BROAD RANGE OF OUTPUT VOLTAGES

PRIORITY CLAIM

This application claims priority to and the benefit of U.S. Provisional Patent Application No. 62/658,625, filed Apr. 17, 2018 and titled "OPERATING MODE FOR A DC-DC CONVERTER," which is incorporated herein by reference in its entirety.

The instant patent application is related to and claims priority from the co-pending India patent application entitled, "OPERATING MODE FOR A DC-DC CONVERTER", Serial No.: 201841023792, Filed: Jun. 26, 2018, which is incorporated in its entirety herewith to the extent not inconsistent with the disclosure herein.

BACKGROUND

Technical Field

Embodiments of the present disclosure relate generally to power converters, and more specifically to an operating mode for a DC-DC converter.

Related Art

A DC-DC converter is a component that generates a DC (Direct Current) voltage from a DC power source. DC-DC converters also typically regulate the DC voltage. The regulated DC voltage may be greater or less than the voltage of the DC power source. DC-DC converters are employed in various environments in which an external circuit requires a regulated DC voltage for its operation.

A DC-DC converter contains an inductor which is energized and de-energized in corresponding phases to obtain the regulated DC output voltage. An operating mode of the DC-DC converter defines the specific respective intervals in which the inductor is energized and de-energized.

Buck mode, boost mode and buck-boost (BB) mode are three well-known modes of operation of a DC-DC converter. In a buck mode, the regulated DC output voltage is less than the unregulated DC input voltage. In a boost mode, the regulated DC output voltage is greater than or equal to the unregulated DC input voltage. In buck-boost mode, the regulated DC output voltage can be either less than, equal to or greater than the unregulated DC input voltage.

However, such modes may not be suitable for at least some environments. Aspects of the present disclosure are directed to an operating mode for a DC-DC converter.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A DC-DC converter includes an inductor, and generates a regulated voltage from a power source. The current flow through the inductor is increased at a first rate in a first interval. In a second interval, the current flow through the inductor is either increased at a second rate or decreased at a third rate depending on whether the regulated voltage is respectively required to be less than or greater than a voltage of the power source. The current flow through the inductor is decreased at a fourth rate in a third interval. The sequence formed by the first interval, the second interval and the third interval is repeated, and followed for all values of the regulated voltage from a lower threshold to a higher threshold. The higher threshold has a value greater than the voltage of the power source. The lower threshold is close to zero volts.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

3. Example DC-DC Converter

Figure 1:
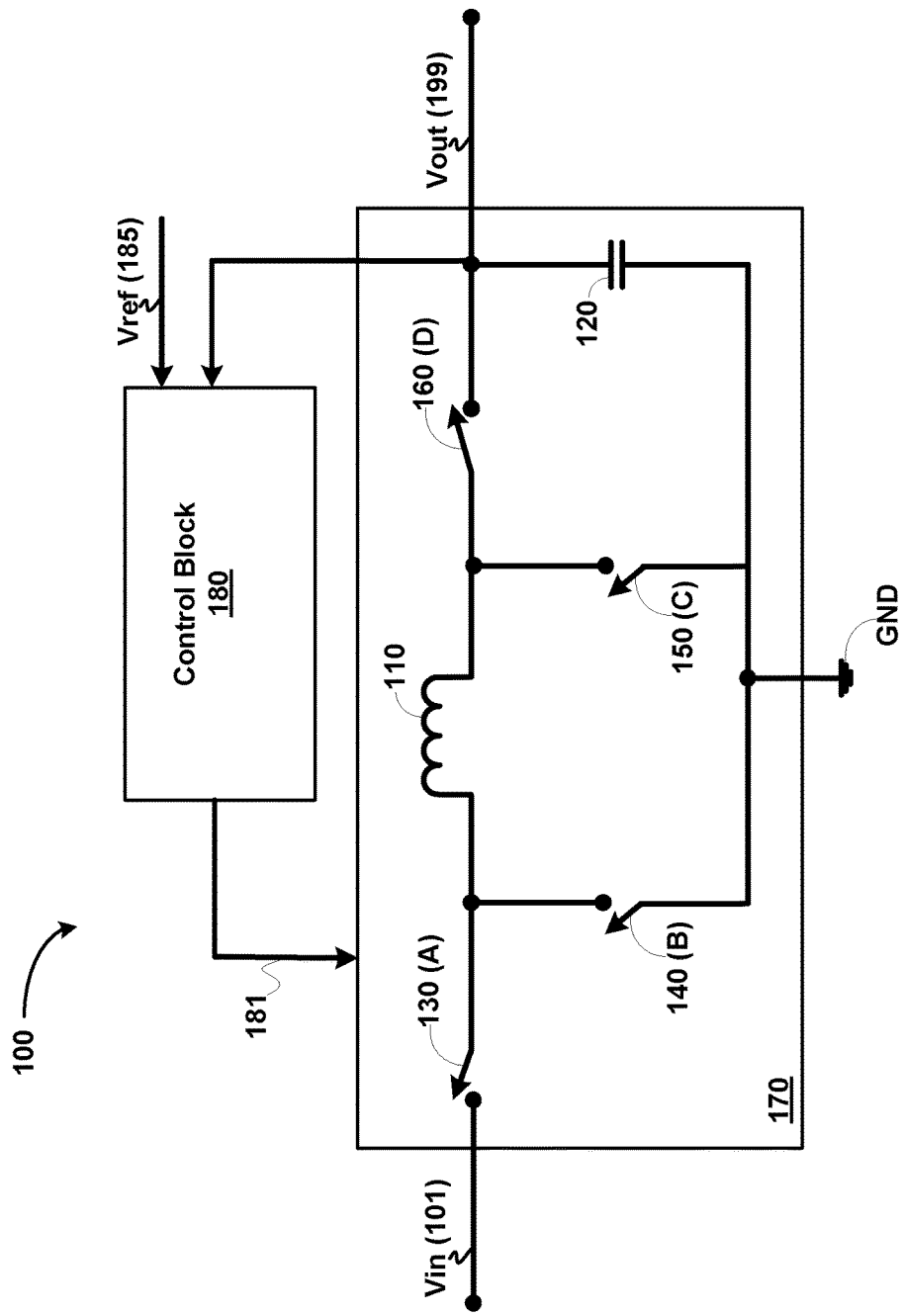
FIG. 1 is a diagram illustrating some details of a DC-DC converter in which several aspects of the present invention can be implemented.

FIG. 1 is a block diagram illustrating some details of a DC-DC converter in which several aspects of the present disclosure can be implemented. DC-DC converter 100 is shown containing circuit portion 170 and control block 180. Portion 170 is shown containing inductor 110, capacitor 120 and power switches 130 (A), 140 (B), 150 (C) and 160 (D). For ease of reference, the four switches are referred to below as switches A, B, C and D respectively. DC-DC converter 100 receives power from a power source (e.g., a battery or unregulated power source) Vin (101), and generates a regulated DC voltage Vout (199). Control block 180 compares Vout (199) with a reference signal Vref (185), and generates switch control signals for controlling the opening/closing of switches A, B, C and D based on the result of the comparison. The details of block 180 in an embodiment of the present disclosure are provided in sections below.

While the details of FIG. 1 and the description below is provided in the context of a hysteretic converter, several features of the present disclosure are applicable to other types of DC-DC converters (such as synchronous/fixed frequency converters) as well. As is well-known in the relevant arts, a hysteretic DC-DC converter employs hysteretic control, and there is no clock or synchronization signal to set the switching frequency. Instead, the switching frequency is set by the hysteresis amount, as well as the operating conditions and delay in the feedback loop.

As is well-known in the relevant arts, and as also noted above, a DC-DC converter can be operated in Buck mode (to generate regulated DC outputs Vout less than or equal to the input source Vin), in Boost mode (to generate regulated DC outputs Vout equal to or greater than the input source Vin), or in Buck-Boost (BB) mode (to generate regulated DC output Vout less than, equal to, or greater than the input source Vin). In Buck mode, switches A and D are closed (with switches B and D open) in energize phases (or charge phases) to cause current build-up in inductor 110, while switches B and D are closed (with switches A and C open) in de-energize (or dump phases) to cause current in inductor 110 to fall. In Boost mode, switches A and C are closed (with switches B and D open) in energize phases (or charge phases) to cause current build-up in inductor 110, while switches A and D are closed (with switches B and C open) in de-energize (or dump phases) to cause current in inductor 110 to fall. In BB mode, switches A and C are closed (with switches B and D open) in energize phases (or charge phases) to cause current build-up in inductor 110, while switches B and D are closed (with switches A and C open) in de-energize (or dump phases) to cause current in inductor 110 to fall. As is well-known in the relevant arts, the efficiency in Buck mode is greater than that in Boost mode, and the efficiency in Boost mode is greater than that in BB mode.

It is recognized that there are difficulties associated with generating Vout when the magnitude of Vout is very nearly equal in magnitude to Vin in either Buck mode or in Boost mode. Consequently, when values of Vout that are required to be generated cover values that are less than Vin as well as greater than Vin, a DC-DC converter may be operated in BB mode for a range of Vout having magnitudes slightly less than Vin, through Vin, to slightly greater than Vin.

Figure 2A:
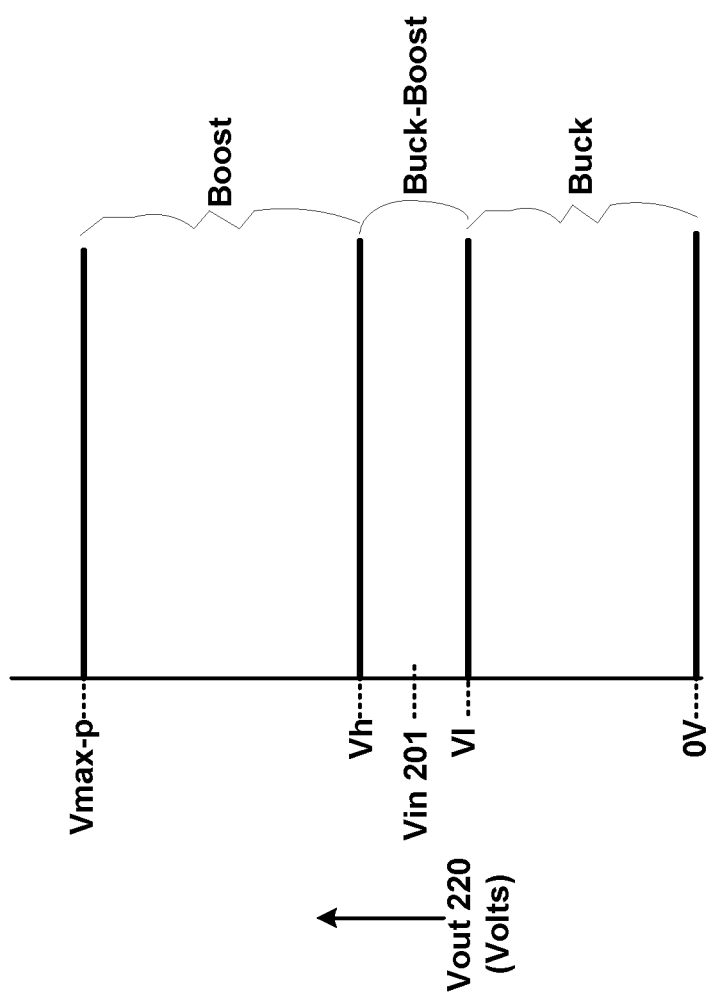
FIG. 2A is a diagram showing the operating modes of a DC-DC converter according to a prior approach.

FIG. 2A shows the operating modes of a DC-DC converter according to a prior approach. The input power source and generated regulated output DC voltage in the prior technique are numbered 201 and 220 respectively in FIGS. 2A, 2B and 2C, and correspond to Vout (199) and Vin (101) of FIG. 1. For magnitudes of Vout (220) from 0 volts to a voltage Vl (for example, 0.75 times Vin 201), the DC-DC converter is operated in Buck mode. For magnitudes of Vout (220) from Vl volts to a voltage Vh (for example, 1.25 times Vin 201), the DC-DC converter is operated in Buck-Boost mode. For magnitudes of Vout (220) from Vh volts to the maximum voltage Vmax-p that can be generated, the DC-DC converter is operated in Boost mode. Vmax-p can theoretically be any voltage greater than Vin (201), but is practically limited due to implementation/manufacturing constraints and/or the specific requirements/application. However such an approach has some drawbacks, as illustrated next with respect to FIGS. 2B and 2C.

As long as the prior DC-DC converter is operating in Buck mode or Boost mode, the prior converter is able to generate the required value of Vout (220). FIG. 2B shows the variation in inductor current (IL) and Vout with respect to time in conventional Buck mode. Boost mode will also display similar variations, except that Vout (220) is always greater than Vin (201). IL represents the current through the inductor (equivalent of inductor 110 of FIG. 1) of the prior converter.

Figure 2C:
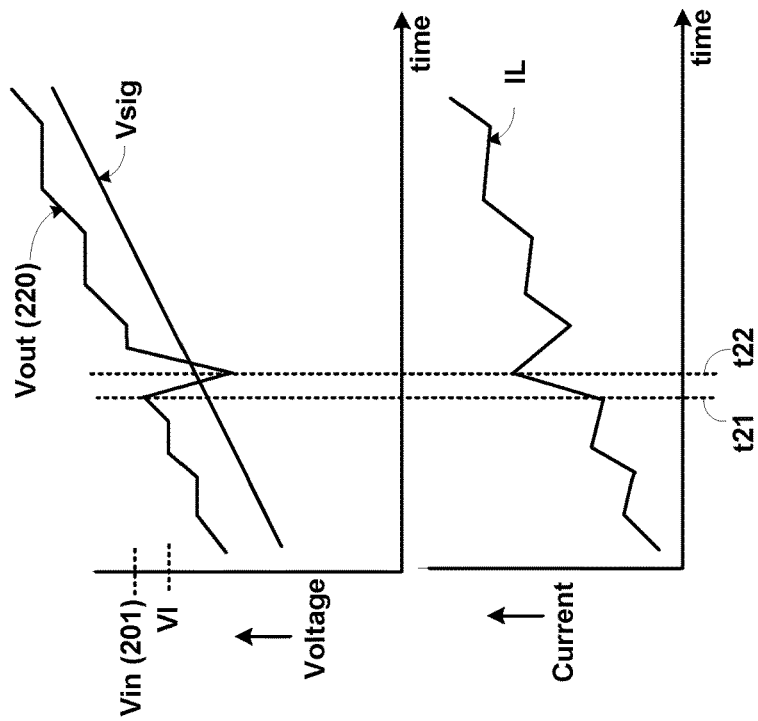
FIG. 2C is a diagram illustrating drawbacks associate with a prior technique when a DC-DC converter transitions from Buck mode to Buck-Boost mode.
Figure 2B:
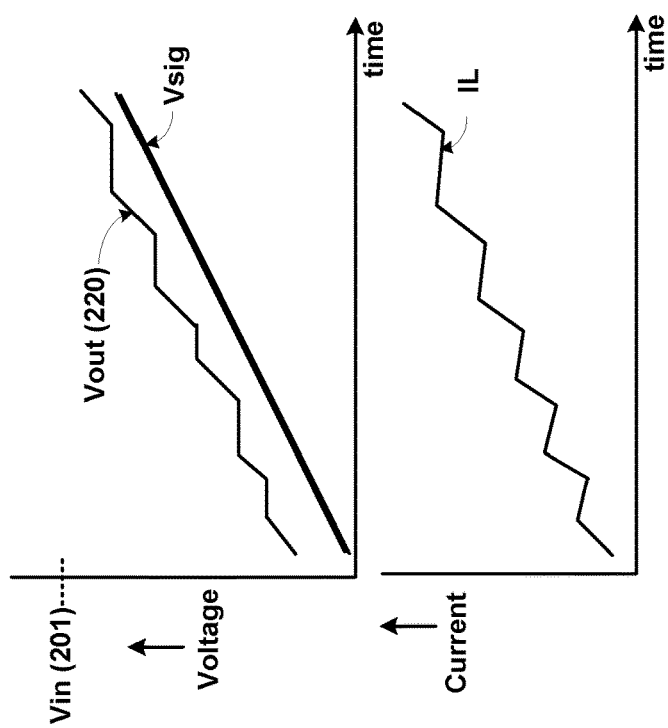
FIG. 2B is a diagram illustrating operation of a DC-DC converter in conventional Buck mode.

FIG. 2C shows the variation in Vout (220) and the requirement of IL as the prior DC-DC converter transitions from Buck mode to BB mode. Till time instant t21, the prior converter operates in the Buck mode. As the required value of Vout (220) increases further, the prior DC-DC converter transitions to BB mode at t21. Since the average inductor current (IL) in Buck mode equals the load current, and since the average inductor current (IL) in BB mode equals (load current/(1−D)), wherein D is the duty cycle of the inductor current, there is an abrupt change in the required average inductor current at t21 (or equivalently at or near Vl (FIG. 2A)). Since BB mode requires a greater value of average inductor current (IL) and since the current through an inductor cannot change instantaneously, Vout (220) can fall below the required value, as shown by the dip in Vout (220) at (and around) t22. The corresponding increased requirement of IL is also shown in FIG. 2C. A similar problem occurs (i.e., abrupt drop in Vout 220 from the required value) can occur during the transition from BB to Boost mode as well. In summary, when the prior DC-DC converter transitions from Buck mode to BB mode, and/or from BB mode to Boost mode, a dip in Vout occurs, which may not be desirable.

Figure 3:
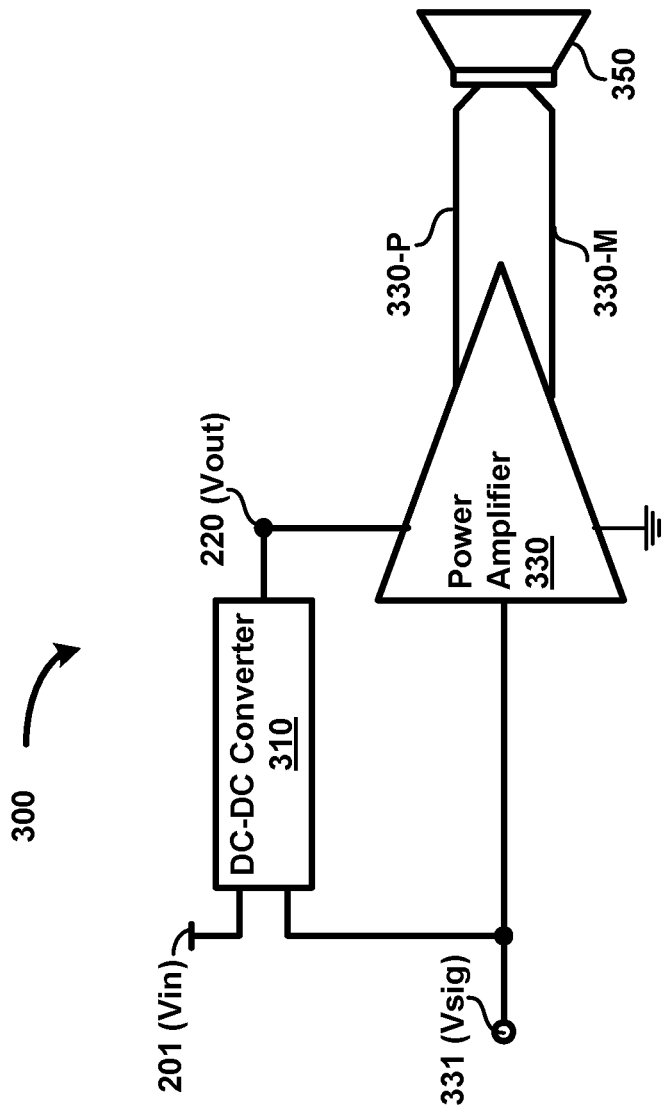
FIG. 3 is a diagram showing an application of a prior DC-DC converter to provide power supply for operation for a power amplifier.

An example use of such a prior DC-DC converter is shown in FIG. 3. The example of FIG. 3 illustrates the details of a class-L amplifier 300, which is described in further detail in U.S. Pat. No. 9,319,495, entitled 'Power Amplifier Providing High Efficiency', which is incorporated in its entirety herewith. Power amplifier 330 receives a signal Vsig (331) (which may, for example, be an audio signal) and generates a corresponding power-amplified output across terminals 330-P and 330-M, which is fed to speaker 350. Power amplifier 330 receives a regulated power supply 220 for operation. Prior DC-DC converter 310 receives signal Vsig and power from power source 201, and generates regulated output voltage 220 such that Vout 220 is always only slightly larger (by a desired predetermined magnitude) in magnitude than Vsig. As a result, efficiency of power amplifier 330 is enhanced. Since signal Vsig can have magnitudes less than, equal to or greater than the voltage of the power source 201, regulated output 220 also may need to have magnitudes less than, equal to or greater than the voltage of the power source 201. However, during transitions from buck mode to BB mode, and BB mode to Boost mode as noted above, the drop in Vout (220) may result in clipping (of the magnitude) of power-amplified output 330-P/330-M, which may not be desirable. In FIG. 2B, Vout (220) is always greater than Vsig by the desired predetermined magnitude noted above. In FIG. 2C, Vout (220) is less than Vsig for a brief duration around t22, which would cause power-amplified output 330-P/330-M to be clipped in such duration.

A DC-DC converter operated according to several aspects of the current disclosure overcomes the problems noted above, and is described in detail next.

4. Operating Mode

Figure 4B:
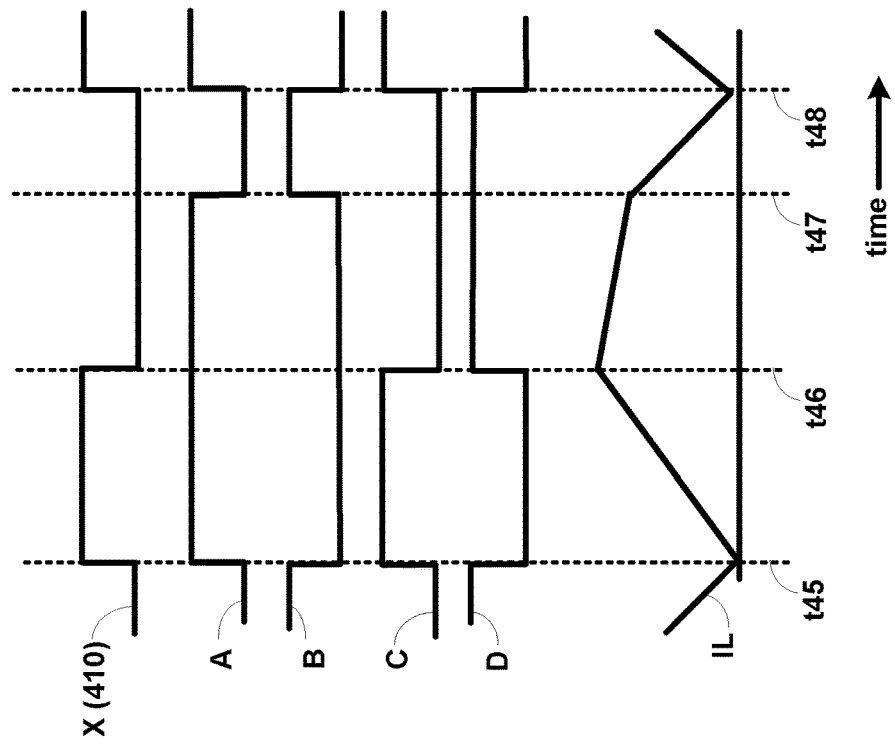
FIG. 4B is an example timing diagram illustrating the operation of a DC-DC converter when providing regulated output voltages greater than the voltage of an unregulated power source in an embodiment of the present disclosure.
Figure 4A:
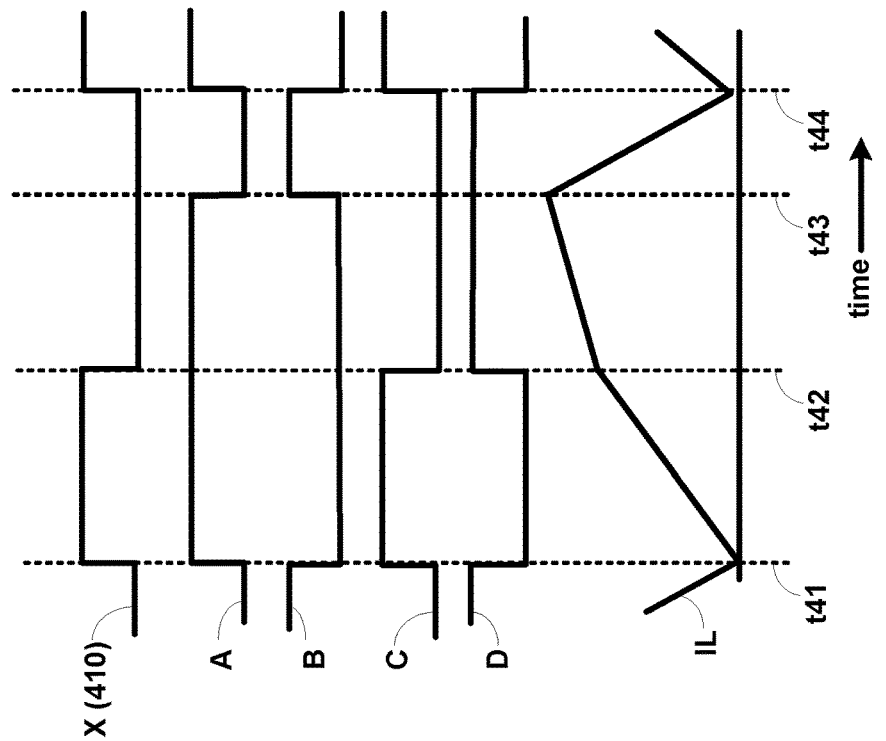
FIG. 4A is an example timing diagram illustrating the operation of a DC-DC converter when providing regulated output voltages less than the voltage of an unregulated power source in an embodiment of the present disclosure.

FIG. 4A and FIG. 4B are timing diagrams that illustrate the operation of DC-DC converter 100 of FIG. 1, implemented according to several aspects of the present disclosure, and as described next with combined reference to FIGS. 4A/4B and FIG. 1.

FIG. 4A illustrates the operation of the switches of DC-DC converter 100 when Vout (199) is less than Vin (101). In FIG. 4A, the sequence of operation of switches A, B, C and D as well as the variation in inductor current IL (current through inductor 110) over one operating cycle is illustrated. In FIG. 4A, a logic high indicates that the corresponding switch is closed, while a logic low indicates that the corresponding switch is open. Signal X (410) is a binary signal generated within block 180, and which indicates whether Vout (199) has a magnitude that is less than or greater than reference signal Vref 185. Vref 185 may either be a fixed voltage (typically, the desired/nominal DC output voltage at output node 199) or a varying voltage such as signal Vsig of FIG. 3 (as further described below).

At time instant t41, signal X (410) transitions to logic high, thus indicating that the magnitude of Vout (199) has fallen below that of Vref. Therefore at t41, switches A and C are closed, and switches B and D are opened. Therefore, inductor 110 is connected between Vin (101) and ground terminal (GND). Consequently, current IL through inductor 110 starts rising. The interval from t41 to t42 can be viewed as a charge (or energize) phase. At t42, signal X transitions to logic low, thereby indicating that Vout (199) is greater than Vref. In response, switch A continues to remain closed, switch C is opened, and switch D is closed.

Starting at t42, with switches A and D closed, inductor 110 is connected between Vin (101) and Vout (120), and inductor current IL continues to increase (since Vin>Vout) but at a slower rate as compared to that in interval t41-t42. The interval from t42 to t43 can be viewed as another (or an intermediate) charge (or energize) phase. The rate of increase of inductor current in interval t42-t43 is generally lower than that in interval t41-t42.

At t43, switch A is opened and switch B is closed. Switches C and D continue to remain open and closed respectively. Consequently, inductor 110 is connected between GND and Vout (199), and inductor current IL starts decreasing in magnitude until t44, at which time instant signal X transitions to high again (indicating that Vout (199) is again smaller than Vref). The interval from t43 to t44 can be viewed as a dump (or de-energize) phase. The cycle from t41-t44 may repeat. The specific durations of each of the three phases (such as phases in intervals t41-t42, t42-t43 and t43-t44) may vary depending on the required value of Vout (199), the instantaneous magnitude of Vref, the load current drawn by the load powered by Vout (199), etc. The duration from t41 to t44 of FIG. 4A represents one switching cycle. A next switching cycle commences when X (410) indicates accordingly (here with a logic high).

It may be observed from FIG. 4A that the operation of the switches in durations t42-t43 and t43-t44 resembles that of a conventional Buck mode (in which only switches A and D are closed in the charge phase, and only switches B and D are closed in the discharge phase). Thus, the introduction of a new phase (as compared to conventional Buck mode operation), namely the phase in which only switches A and D are closed, renders the operation more similar to that in conventional Buck mode when Vout (199) is less than Vin (101). As a result, DC-DC converter 100 is associated with less power loss due to $I^2R$ losses in the switches. Thus, the efficiency of DC-DC converter 100 is greater than if it were operated in purely BB mode. Additionally, it may be noted that there is no abrupt change from Buck to BB mode, the three-phase operation shown in FIG. 4A being a new operating mode by itself. As a result, the problem of dip in Vout associated with the prior technique (as noted above) does not occur.

FIG. 4B illustrates the operation of the switches of DC-DC converter 100 when Vout (199) is greater than Vin (101). In FIG. 4B also, a logic high indicates that the corresponding switch is closed, while a logic low indicates that the corresponding switch is open. Signal X (410) is the same as that of FIG. 4A. The durations of signal X in logic high and logic low states are shown identical to that in FIG. 4A merely for ease of description. In general, such durations of signal X depend on the specific value of Vout (120) required, the instantaneous value of Vref, the magnitude of load current drawn by the load/circuit that is powered by Vout (199), etc.

At time instant t45, signal X (410) transitions to logic high, thus indicating that the magnitude of Vout (199) has fallen below that of Vref. Therefore at t45, switches A and C are closed, and switches B and D are opened. Therefore, inductor 110 is connected between Vin (101) and ground terminal (GND). Consequently, current IL through inductor 110 starts rising. The interval from t45 to t46 can be viewed as a charge (or energize) phase. At t46, signal X transitions to logic low, thereby indicating that Vout (199) is greater than Vref. In response, switch A continues to remain closed, switch C is opened, and switch D is closed.

Starting at t46, with switches A and D closed, inductor 110 is connected between Vin (101) and Vout (120), and inductor current starts to fall (since Vout>Vin). The interval from t46 to t47 can be viewed as an intermediate dump phase.

At t47, switch A is opened and switch B is closed. Switches C and D continue to remain open and closed respectively. Consequently, inductor 110 is connected between GND and Vout (199), and inductor current IL continues decreasing in magnitude (but at a greater rate than that in interval t46-t47) until t48, at which time instant signal X transitions to high again (indicating that Vout (199) is again smaller than Vref). The interval from t47 to t48 can be viewed as another dump phase. The cycle from t45-t48 may repeat. The duration from t45 to t48 of FIG. 4B represents one switching cycle. A next switching cycle commences when X (410) indicates accordingly (here with a logic high). The specific durations of each of the three phases (such as phases in intervals t45-t46, t46-t47 and t47-t48) may vary depending on the required value of Vout (199), the load current drawn by the load powered by Vout (199), etc. Phases equivalent to those in intervals t42-t43 and t46-t47 may be viewed as intermediate phases.

It may be observed from FIG. 4B that the operation of the switches in durations t45-t46 and t46-t47 resembles that of a conventional Boost mode (in which only switches A and C are closed in the charge phase, and only switches A and D are closed in the discharge phase). Thus, the introduction of a new phase (as compared to conventional Boost mode operation), namely the phase in which only switches A and D are closed, renders the operation more similar to that in conventional Boost mode when Vout (199) is greater than Vin (101). As a result, DC-DC converter 100 is associated with less power loss due to $I^2R$ losses in the switches. Thus, the efficiency of DC-DC converter 100 is greater than if it were operated in purely BB mode. Additionally, it may be noted that there is no abrupt change from BB to Boost mode, the three-phase operation shown in FIG. 4B being a new operating mode by itself. As a result, the problem of dip in Vout associated with the prior technique (as noted above) does not occur.

Thus, according to aspects of the present disclosure, DC-DC converter 100 is operated in a three-phase mode, in which the operations of the switches A, B, C and D in each of the phases are identical irrespective of whether Vout (199) is greater than or less than Vin (101). The operations of the switches A, B, C and D depend only on the binary value of signal X. Thus, the same three-phase mode is used for all values of Vout (199) from the range 0 to Vmax (450) volts. Vmax (450 in FIG. 4C) can theoretically be any voltage greater than or less than Vin (101), but may be practically limited due to implementation/manufacturing constraints and/or the specific requirements/application. Vmax (450) is usually application-specific and may be limited by the voltage tolerance of the manufacturing process used to manufacture DC-DC converter 100.

Figure 8:
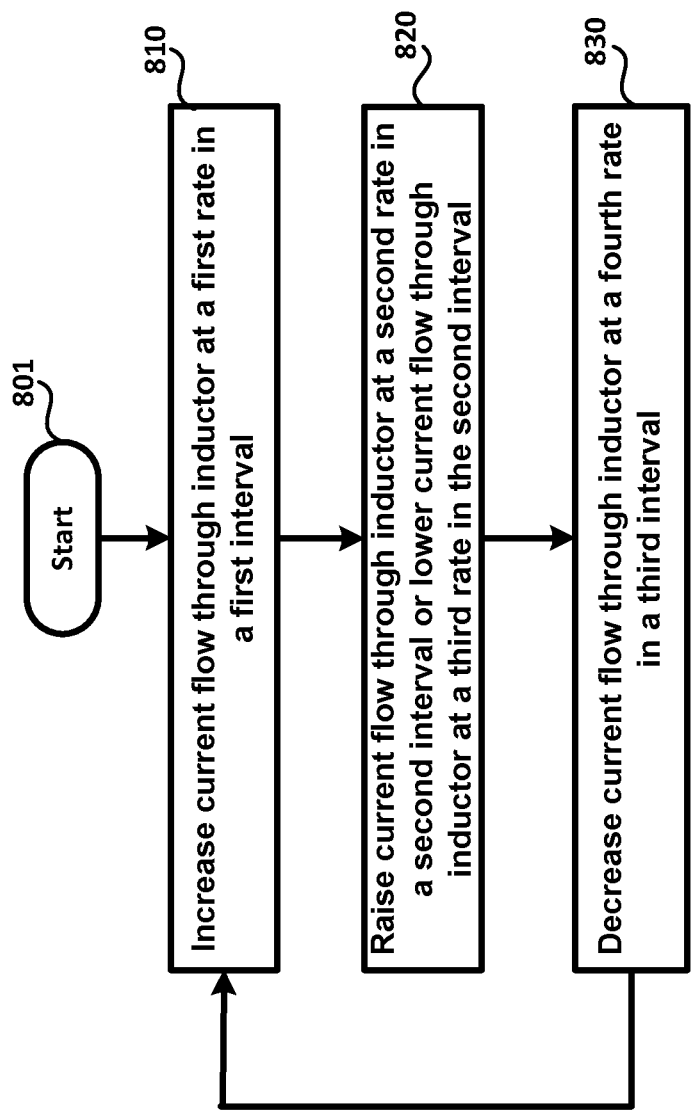
FIG. 8 is a flowchart illustrating the manner in which a DC-DC converter is operated, in an embodiment of the present disclosure.

FIG. 8 is a flowchart illustrating the manner in which a DC-DC converter is operated in an embodiment of the present disclosure. The flowchart starts in step 801, in which control immediately passes to step 810.

In step 810, control block 180 causes current flow through inductor 110 to increase at a first rate for the duration of a first interval. Thus, control block 180 closes switches A and C, and opens switches B and D. Therefore, inductor 110 is connected between Vin (101) and ground terminal (GND), and current IL through inductor 110 starts rising. The rate of increase (i.e., slope of inductor current line between t41 and t42 or between t45 and t46) is determined by the inductance of inductor 110 and voltage Vin (101). Control then passes to step 820.

In step 820, control block 180 causes current flow through inductor 110 to be raised at a second rate for the duration of a second interval when Vout (199) is required to be less than Vin (101), but causes current flow through inductor 110 to be lowered at a third rate in the second interval when Vout (199) is required to be greater than Vin (101). Accordingly, control block 180 closes switches A and D, and opens switches B and C. Therefore, inductor 110 is connected between Vin (101) and Vout (199), and current IL through inductor 110 either rises at the second rate (when Vout is less than Vin) or falls at the third rate (when Vout is greater than Vin). The rate of rise (second rate) in inductor current (depicted by inductor current line between t42 and t43 in FIG. 4A) when Vout (199) is greater than Vin (101) is determined by the difference between Vout (199) and Vin (101) and the inductance of inductor 110. The second rate may be less than the first rate. The rate of fall (third rate) in inductor current (depicted by inductor current line between t46 and t47 in FIG. 4B) when Vout (199) is greater than Vin (101) is also determined by the difference between Vout (199) and Vin (101) and the inductance of inductor 110. Control then passes to step 830.

In step 830, control block 180 causes current flow through inductor 110 to decrease at a fourth rate for the duration of a third interval. Accordingly, control block 180 closes switches A and D and opens switches A and C in the third interval, thereby causing current through inductor 110 to decrease at the fourth rate. The rate of decrease (fourth rate) (depicted by inductor current lines between t43-t44 in FIG. 4A, and between t47-t48 in FIG. 4B) is determined by Vout (199) and the inductance of inductor 110, and may be greater than the third rate. Control then passes to step 810, and the steps of the flowchart may be repeated.

The first interval, the second interval and the third interval are contiguous, and the sequence formed by the first interval, the second interval and the third interval is repeated to cause a next instance of the first interval to immediately follow an immediately previous instance of the third interval. Further, the sequence is followed for all values of Vout (199) from a lower threshold (e.g., 460) to a higher threshold (Vmax 450). Vmax 450 is greater than Vin 101, while the lower threshold is close to zero volts.

DC-DC converter 100, implemented according to various aspects of the present disclosure, can be used in place of prior DC-DC converter 310 (of FIG. 3, and with (with Vin 201 replaced by Vin 101, and Vout 220 replaced by Vout 199)) of class-L amplifier 300 (FIG. 3) to supply operating power to power amplifier 330 (of FIG. 3). In an embodiment, DC-DC converter 100, used in place of converter 310, receives Vin (101) as well as Vsig 331 (as Vref 185), and generates Vout (199) to have an instantaneous magnitude that is only slightly larger than the instantaneous absolute value (i.e., ignoring the sign or polarity) of Vsig 331. The difference between the instantaneous magnitude of Vout (199) and the instantaneous absolute value of Vsig is termed 'headroom', and is clarified further with respect to the illustration of FIG. 7.

Figure 7:
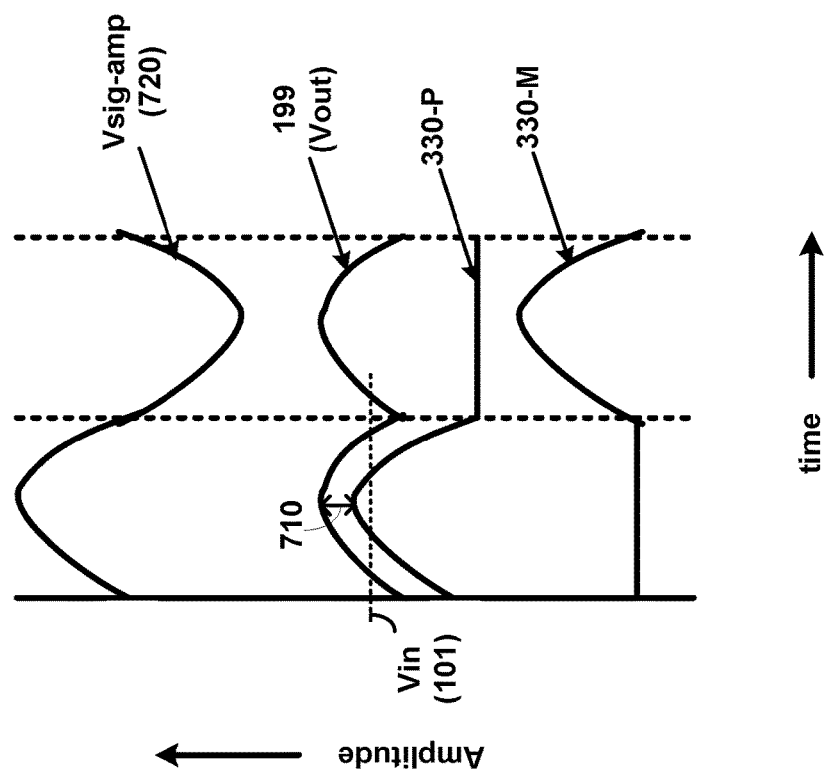
FIG. 7 is an example diagram illustrating the manner in which the regulated output voltage of a DC-DC converter is modulated in an embodiment of the present disclosure.

FIG. 7 is an example diagram illustrating the manner in which Vout (199) is modulated in an embodiment of the present disclosure. Output 199 tracks the output signal 330-P/330-M with a headroom. Each of signals 330-P and 330-M is shown as a half sine wave which together differentially represent a sine wave 720 (Vsig-amp), as illustrated in FIG. 7. Vsig-amp (720) is a power-amplified version of Vsig 331. Regulated output voltage 199 is shown 'tracking' the higher of signals 330-P and 330-M. Although a single tone (pure sine wave) is shown in the illustration of FIG. 7, in an embodiment, such tracking may be provided over the entire range of audio frequencies (20 Hz to 20 KHz) of signals 330-P/330-M. Marker 710 in FIG. 7 represents the instantaneous difference between output 199 and the voltage of the greater of signals 330-P and 330-M (or equivalently the instantaneous absolute value of Vsig-amp 720), and the instantaneous difference represents the 'headroom'.

Figure 4C:
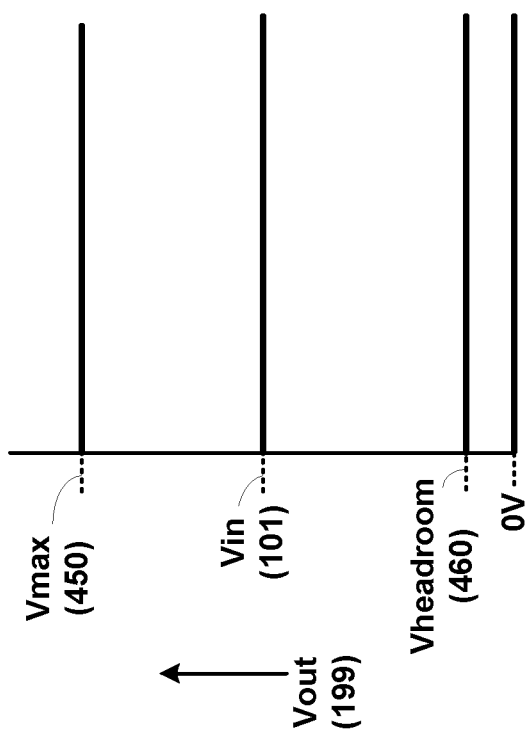
FIG. 4C is a diagram showing the range of output voltages that can be generated by a DC-DC converter in an embodiment of the present disclosure.

FIG. 4C shows the range of values of Vout (199) that can be generated by DC-DC converter 100 in an embodiment of the present disclosure. The lower threshold for Vout (199) is Vheadroom (460), and the upper threshold for Vout (199) is Vmax (450). It should be appreciated that Vheadroom 460 is close to zero (negative or positive magnitude in respective polarities of operation), and in an embodiment the headroom equals 50 millivolts. Thus, although Vout 199 can in general vary from 0 volts to Vmax (450), when used in class-L amplifier 300 the lower threshold (limit) of Vout (199) may be approximately 50 millivolts. The upper threshold (Vmax 450) in the embodiment is 8.5 volts. While a much higher value than 50 millivolts reduces the efficiency of a device (e.g, power amplifier 330) powered by Vout (199) with a positive correlation, a value smaller than 50 millivolts causes the signal generated by the device (power amplifier) that is powered by Vout to get clipped (which is undesirable). Thus the lower threshold is generally chosen close to zero while balancing such requirements.

The manner in which control signals for the power switches of DC-DC converter 100 are generated in an embodiment of the present disclosure is described next.

5. Control Block

Figure 5:
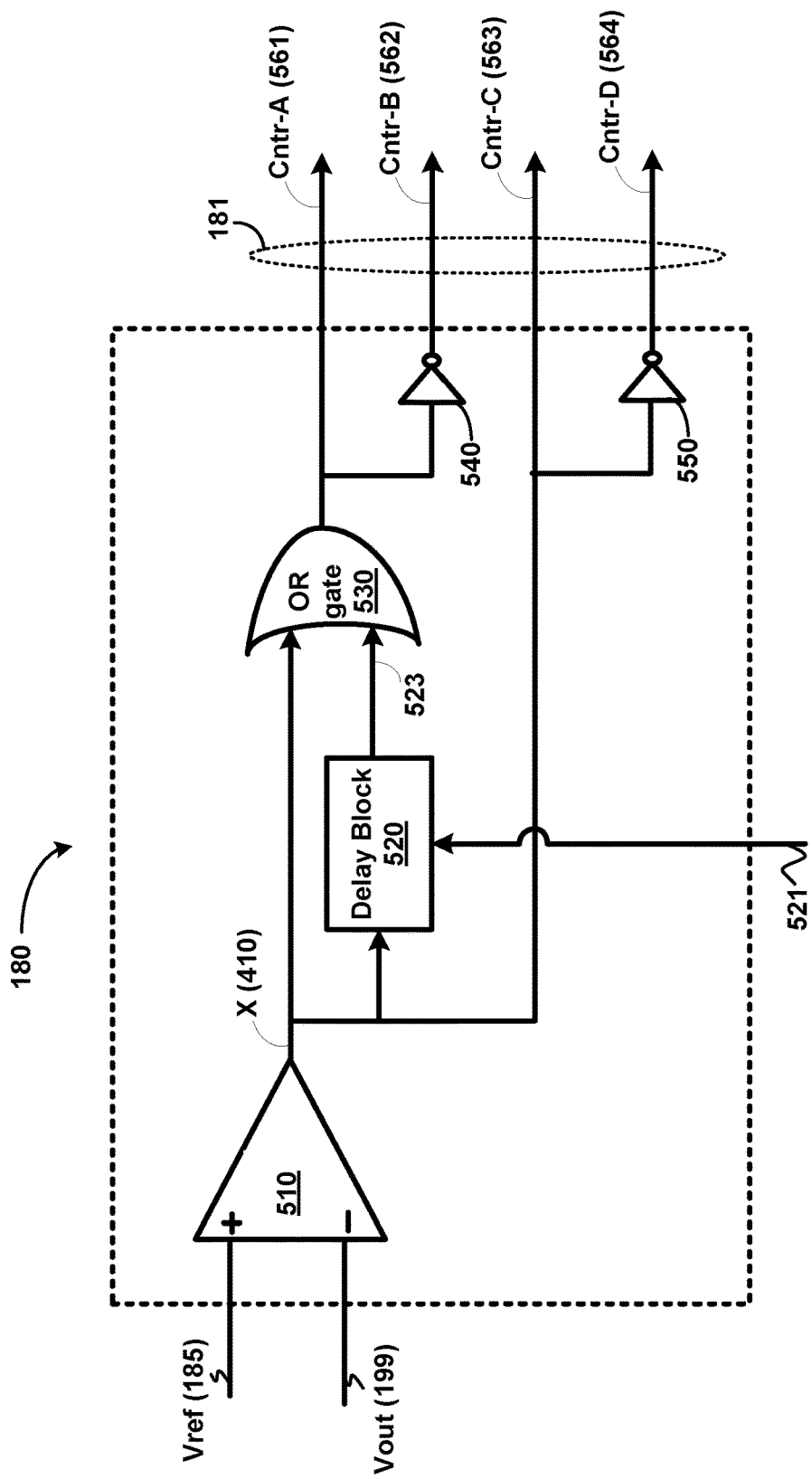
FIG. 5 is a block diagram illustrating the implementation details of a portion of a DC-DC converter in an embodiment of the present disclosure.

FIG. 5 is a block diagram illustrating the implementation details of block 180 (FIG. 1) in an embodiment of the present disclosure. Block 180 is shown containing comparator 510, delay block 520, OR gate 530, and inverters 540 and 550. Block 180 generates switch control signals 561, 562, 563 and 564, which respectively control the opening/closing of switches A, B, C and D. A logic high value of a switch control signal closes the switch, while a logic low value opens the switch, although the inverse of the logic values can also be used instead depending on the implementation of the switches. The specific voltages corresponding to logic high and logic low values of the switch control signals (specifically for switches A and D) may be suitably generated (e.g., using charge pump circuits in control block 180) depending on the specific requirements, and only the logic values are indicated herein. In an embodiment, each of switches A, B, C and D is an N-type metal oxide semiconductor (NMOS) transistor. It is noted here that although signals A and B (as well as C and D) are shown as being the complement of each other, in practice there may be a finite non-overlap duration between these signals.

Comparator 510 receives Vref (185) and Vout (199), and generates signal X (410) with one binary value if Vout (199) is greater than Vref (185), and with the other binary value if Vout (199) is less than Vref (185). Comparator 510 may be designed to have hysteresis. Alternatively, the feedback path from Vout (199) to signals 181 may be designed to have an in-built delay. It is assumed herein that X is a logic high when Vout (185) is less than Vref (199), and a logic low otherwise.

In addition (although not shown), X (410) can be generated based (additionally) on inductor current information (i.e., present (instant) magnitude of current flowing through inductor 110) also (in addition to magnitude of Vout 199), thereby employing an additional feedback loop. In an embodiment, X (410) is generated based on comparison of the sum of Vout 199 and magnitude of sensed inductor current ((IL (sensed)) with Vref 185. Thus, the mathematical operation represented by [(Vout+IL (sensed))>Vref] is evaluated (wherein '>' represents a 'greater than' operation), and if the evaluation is true, then X (410) is asserted (here logic high). The addition of Vout and IL (sensed) can be done in a known way, with a comparator (such comparator 510) being used for comparing the sum of Vout and IL (sensed) with Vref. Present/instant magnitude of the inductor current can be determined in a known way using corresponding current measurement components/blocks. For example, a small-valued resistor can be implemented in series with inductor 110, and the voltage across the resistor can be measured by a suitable circuit. The inductor current can be determined as the ratio of the measured voltage and the resistance of the resistor. Alternatively, current mirrors can be used to obtain a measure of the current flowing through inductor 110. It may be noted that X (410) indicates whether a next switching cycle is to commence or not.

Delay block 520 is designed to add a delay to signal X, and generate a delayed signal as its output. OR gate 530 receives X and the delayed output of delay block 520, and provides output Cntr-A (561) (extended signal) as output, which controls the operation of switch A. In an embodiment, the delay contributed by delay block 520 is fixed. In an alternative embodiment, the delay is programmable via an external input 521 (although such input is not shown in FIG. 1). Referring to FIGS. 4A and 4B, it may be appreciated that for greater efficiency, the duration of phase t42-t43 of FIG. 4, and the duration of phase t46-t47 should be as large as possible. Programmability of the delay contributed by delay block 520 enables selection of a desired length of the intermediate phases t42-t43 and t46-t47.

Ideally, intermediate phases (t42-t43 and t46-t47) should be as long as possible. However, too long a duration may render the inductor current ripple larger. In practice, a duration equal to one-third of the switching period (t41-t44 or t45-t48) may be employed. Delay block 520 may be implemented, for example, in the form of one or more digital delay elements, with the specific number of delay elements (and therefore the delay) being selectable using a multiplexer. Alternatively, delay block 520 can also be implemented in analog fashion, for exampling, based on charging and discharging capacitor(s). The combination of delay block 520 and OR gate 530 may be viewed as a pulse extender block. A pulse extender block operating as noted above can be implemented using other techniques as well (for example, using latches or flip-flops), as would be apparent to one skilled in the relevant arts.

Inverter 540 provides the logical inverse of Cntr-A (561) as the switch control signal Cntr-B (562) for closing and opening switch B. Switch control signal Cntr-C (563) for closing and opening switch C has the same logic as signal X. Inverter 550 provides the logical inverse of Cntr-C (563) as the switch control signal Cntr-D (564) for closing and opening switch D. The four switch control signals are deemed to be contained in path 181 of FIG. 1.

According to another aspect of the present disclosure, when the load current drawn by the circuit/device powered by Vout (199) is very large (i.e., greater than a threshold value), or for values of Vout (199) much larger (by some threshold value) than Vin (101), DC-DC converter 100 automatically transitions to Boost mode, as described next.

6. Automatic Transition to Boost Mode

As load current (current drawn by a load powered by Vout 199) increases, the voltage drop across the power switches (in particular switches A and D) increases. To compensate for such voltage drop, DC-DC converter 100 may increase the duty cycle, which is the ratio of duration of charge phase to duration of dump phase(s). For example, in FIG. 4B, the duty cycle is the ratio [(t45-t46/(t45-t48)]. As a result, the average value of inductor current (current through inductor 110) increases to meet the increased load current requirement. As noted above, conventional Boost mode is more efficient than BB mode as well as the three-phase mode described above. It is now described below that the three-phase mode when Vout (199) is greater than Vin (101) (as described above with respect to FIG. 4B), automatically transitions to conventional Boost mode when load current increases above a pre-determined threshold.

Figure 6:
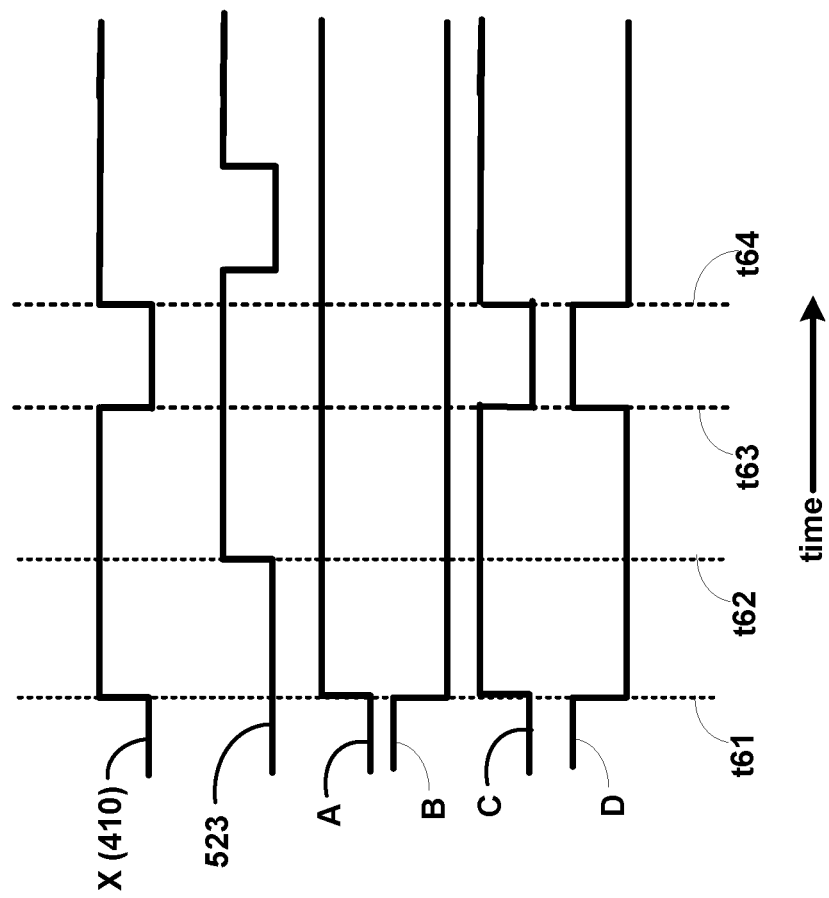
FIG. 6 is an example timing diagram illustrating the automatic transition of a DC-DC converter from three-phase operation to conventional Boost mode, in an embodiment of the present disclosure.

FIG. 6 is an example timing diagram illustrating the automatic transition of DC-DC converter 100 to conventional Boost mode. Signal X (410) transitions to logic high at t61 in response to Vout (199) becoming less than Vref (185). Delayed version 523 of signal X transitions to logic high at t62. Interval t61-t62 represents the delay contributed by delay block 520. Signal X (410) transitions to logic low at t63 in response to Vout (199) becoming greater than Vref (185). However, since the load current is high, the next transition of signal X to logic high comes much earlier (than when the load current is relatively smaller, as for example, shown with respect to FIG. 4B). However, the delay (termed "auto-tran time") introduced by delay block 520 causes signal 523 to remain high even after signal X (410) has transitioned to logic high at t64. As a result switch A remains closed throughout cycle t61-t64. In following cycles also, switch A would remain closed if the high load current requirement persists.

Since switch A remains always closed, switch B remains always open. The states of C and D for the cycle t61-t64 are also shown in FIG. 6, and may be verified from the circuit of FIG. 5. From FIG. 6, it may be observed that switches A and C are closed (with switches B and D open) in interval t61-t63, while switches A and D are closed (with switches B and C open) in interval t63-t64. Interval t61-t63 is a charge phase, and interval t63-t64 is a dump phase. Therefore, in cycle t61-t64 (and possibly subsequent cycles depending on the load current) DC-DC converter 100 operates in conventional Boost mode. Thus, the three-phase operation implemented using the technique of FIG. 5 (in particular the extension of the closed duration of switch A), automatically causes DC-DC converter 100 to transition to conventional Boost mode operation for high load currents. The threshold load current that causes automatic transition to Boost mode is determined by the magnitude of delay introduced by delay block 520, and is therefore programmably controllable by programming the delay based on a desired value of such threshold.

It may be appreciated that such transition to conventional Boost mode would also occur when Vout (199) is required to be much larger than Vin (101). In an embodiment, the delay provided by delay block 520 is 400 nanoseconds, Vin (101) is 3.6 volts, and automatic transition to Boost mode occurs when load current crosses 1.5 Amperes and Vout (199) crosses 1.6*Vin (1.6 times Vin 101))

Several advantages of DC-DC converter 100 implemented according to aspects of the present disclosure are now summarized. The three-phase operation provides an efficiency that is greater than in conventional BB mode, and may be comparable to that of conventional Buck or Boost mode. There are no limitations/drawbacks when magnitude of Vout (199) is in the vicinity (including slightly greater than and slightly less than) of Vin (101). For values of Vout (199) much greater than Vin (101) and/or large values of load current, DC-DC converter 100 automatically transitions to conventional Boost mode. The auto-tran time can be selected based on specific requirements. By maximizing auto-tran time, the efficiency of DC-DC converter 100 can be very close to that in conventional Buck mode (when Vout<Vin) and Boost mode (when Vout>Vin). There is no requirement to detect the magnitudes of Vout (199) and Vin (101) to make a decision of whether to switch modes since there is only one three-phase operating mode (which automatically transitions to conventional Boost mode for the conditions noted above).

When used in place of prior DC-DC converter 310 in class-L amplifier 300 of FIG. 3 (and with Vin 210 replaced by Vin 101, and Vout 220 replaced by Vout 199 in FIG. 3), DC-DC converter 100 can prevent clipping of output signal 330-P/330-M of power amplifier 330 of FIG. 3. It may also be appreciated that the benefits of using DC-DC converter 100 is not limited to the context of FIG. 3 (in which continuous power supply modulation depending on the magnitude of the signal to be amplified is employed). DC-DC converter 100 can be employed in contexts where there is no requirement of power supply modulation also, thereby providing the benefits noted above in such environments also. When/if efficiency is not a concern, the additional efficiency thus obtained can be traded-off to reduce chip implementation area by tolerating larger ON resistance of the switches.

When the techniques described above are implemented in other types of DC-DC converters, such as for example fixed-frequency converters, the intermediate phase (which equals the "auto-tran" time) may be made a fixed fraction (e.g., one-third) of the (fixed) switching period of such converters.

DC-DC converter 100 designed according to several aspects of the present disclosure can be implemented in Integrated Circuit (IC) form, or using discrete components. In an embodiment, the device of FIG. 3 (with DC-DC converter 100 in place of prior converter 310) is also implemented in IC form.

7. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1 through 6, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals. In the instant application, power and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A method of operating a DC-DC converter to generate a regulated output voltage from a power source, said DC-DC converter comprising an inductor, said method comprising:
    increasing current flow through said inductor at a first rate in a first interval;
    raising current flow through said inductor at a second rate in a second interval when a magnitude of said regulated output voltage is required to be less than a voltage of said power source, but lowering current flow through said inductor at a third rate in said second interval when a magnitude of said regulated output voltage is required to be greater than said voltage of said power source; and
    decreasing current flow through said inductor at a fourth rate in a third interval;
    wherein said first interval, said second interval and said third interval are contiguous,
    wherein a sequence formed by said first interval, said second interval and said third interval is repeated to cause a next instance of said first interval to immediately follow an immediately previous instance of said third interval, wherein said first rate, said second rate, said third rate and said fourth rate have unequal values in each cycle of said sequence, wherein said sequence is followed for all values of said regulated output voltage from a lower threshold to higher threshold, wherein said higher threshold has a value greater than a voltage of said power source, wherein said lower threshold is close to zero voltage having a magnitude less than one percentage of magnitude of said higher threshold.

2. The method of claim 1, wherein, in said first interval, said inductor is coupled between said power source and a constant reference potential to cause said increasing, wherein, in said second interval, said inductor is coupled between said power source and an output terminal on which said regulated output is provided to either cause said raising or said lowering, and wherein, in said third interval, said inductor is coupled between said constant reference potential and said output terminal to cause said decreasing.

3. The method of claim 2, wherein said regulated output voltage always exceeds, by a headroom value, the instantaneous magnitude of an output signal of a device powered by said DC-DC converter.

4. The method of claim 3, wherein said higher threshold equals a maximum voltage that is supported by a manufacturing technique employed to manufacture said DC-DC converter.

5. The method of claim 2, wherein said DC-DC converter is a hysteretic converter.

6. The method of claim 1, wherein a duration of said second interval is programmable.

7. The method of claim 1, further comprising:

comparing said regulated output voltage with a reference voltage;

generating a binary signal to have a first logic level if a magnitude of said regulated output voltage is greater than a magnitude of said reference voltage, and to have a second logic level if said magnitude of said regulated output voltage is less than or equal to than a magnitude of said reference voltage;

extending the duration of said binary signal to generate an extended signal, wherein said extended signal is applied to control the operation of a first switch in said DC-DC converter;

generating a logical inverse of said extended signal, wherein said logical inverse of said extended signal is applied to control the operation of a second switch in said DC-DC;

applying said binary signal to control the operation of a third switch in said DC-DC converter; and generating a logical inverse of said binary signal, wherein said logical inverse of said binary signal is applied to control the operation of a fourth switch in said DC-DC, wherein the operation of said first switch, said second switch, said third switch and said fourth switch cause said sequence to occur.

8. The method of claim 7, further comprising determining a present magnitude of a current flowing through said inductor, wherein said binary signal is additionally dependent on said present magnitude of said current flowing through said inductor, wherein said extending is achieved by performing a logical OR operation of said binary signal and a delayed version of said binary signal.

9. The method of claim 8, wherein application of said extended signal, said logical inverse of said extended signal, said binary signal and said logical inverse of said binary signal to operate the corresponding switches causes said DC-DC converter to transition to conventional Boost mode for values of load currents greater than a pre-determined threshold, wherein said pre-determined threshold is determined by the extent of delay of said delayed version with respect to said binary signal, wherein said DC-DC converter is comprised in a class-L amplifier.

10. A DC-DC converter to receive power from a power source and to generate a regulated voltage at an output node of said DC-DC converter, said DC-DC converter comprising an inductor and a control block, wherein said control block is designed to:

increase current flow through said inductor at a first rate in a first interval;

raise current flow through said inductor at a second rate in a second interval when a magnitude of said regulated output voltage is required to be less than a voltage of said power source, but lower current flow through said inductor at a third rate in said second interval when a magnitude of said regulated output voltage is required to be greater than said voltage of said power source; and decrease current flow through said inductor at a fourth rate in a third interval;

wherein said first interval, said second interval and said third interval are contiguous, wherein a sequence formed by said first interval, said second interval and said third interval is repeated to cause a next instance of said first interval to immediately follow an immediately previous instance of said third interval, wherein said first rate, said second rate, said third rate and said fourth rate have unequal values in each cycle of said sequence, wherein said sequence is followed for all values of said regulated output voltage from a lower threshold to higher threshold, wherein said higher threshold has a value greater than a voltage of said power source, wherein said lower threshold is close to zero voltage having a magnitude less than one percentage of magnitude of said higher threshold.

11. The DC-DC converter of claim 10, further comprising:

a capacitor coupled between said output node and a constant reference potential;

a first switch, wherein a first terminal of said first switch is coupled to a power source, wherein a second terminal of said first switch is coupled to a first terminal of said inductor;

a second switch, wherein a first terminal of said second switch is coupled to said first terminal of said inductor, wherein a second terminal of said second switch is coupled to said constant reference potential;

a third switch wherein a first terminal of said third switch is coupled to a second terminal of said inductor, wherein a second terminal of said third switch is coupled to said constant reference potential; and a fourth switch, wherein a first terminal of said fourth switch is coupled to said second terminal of said inductor, wherein a second terminal of said fourth switch is coupled to said output node, wherein said control block:

closes each of said first switch and said third switch, as well as opens each of said second switch and said fourth switch, in said first interval to cause said increase;

closes each of said first switch and said fourth switch, as well as opens each of said second switch and said third switch, in said second interval to cause either said or raise or said lowering;

closes each of said second switch and said fourth switch, as well as opens each of said first switch and said third switch, in a third interval to cause said decrease; and repeats said sequence comprising said first interval, said second interval and said third interval to cause a next instance of said first interval to immediately follow an immediately previous instance of said third interval.

12. The DC-DC converter of claim 11, wherein said regulated output voltage is designed to always exceed by a headroom value, the instantaneous magnitude of an output signal of a device powered by said DC-DC converter, wherein said higher threshold equals a maximum voltage that is supported by the manufacturing technique employed to manufacture said DC-DC converter.

13. The DC-DC converter of claim 12, wherein said control block comprises:

a comparator and a current-measurement circuit to generate a binary signal indicating that a next switching cycle is to commence;

an extender block to generate an extended version of said binary signal, wherein said extended version controls operation of said first switch;

a first inverter to generate the logical inverse of said extended version, wherein said logical inverse of said extended version controls operation of said second switch; and a second inverter to generate the logical inverse of said binary signal, wherein said logical inverse of said binary signal controls operation of said fourth switch, wherein said binary signal controls operation of said third switch.

14. The DC-DC converter of claim 13, wherein said extender block comprises:

a delay block to delay to introduce a delay in said binary signal to generate a delayed signal; and an OR gate to generate the logical OR result of said binary signal and said delayed signal.

15. The DC-DC converter of claim 14, wherein said delay is programmable via an external input, wherein said DC-DC converter is comprised in a class-L amplifier.

16. The DC-DC controller of claim 11, wherein said DC-DC converter is a hysteretic converter.

17. An article of manufacture comprising:

a power amplifier coupled to receive an input signal, said power amplifier designed to generate a corresponding power-amplified output signal; and a DC-DC converter to generate a regulated DC voltage on an output node from an unregulated power source, wherein a magnitude of said regulated DC voltage depends on a voltage of said power-amplified output signal, wherein said DC-DC converter comprises an inductor and a control block, wherein said control block is designed to:

increase current flow through said inductor at a first rate in a first interval;

raise current flow through said inductor at a second rate in a second interval when a magnitude of said regulated output voltage is required to be less than a voltage of said power source, but lower current flow through said inductor at a third rate in said second interval when a magnitude of said regulated output voltage is required to be greater than said voltage of said power source; and decrease current flow through said inductor at a fourth rate in a third interval;

wherein said first interval, said second interval and said third interval are contiguous, wherein a sequence formed by said first interval, said second interval and said third interval is repeated to cause a next instance of said first interval to immediately follow an immediately previous instance of said third interval, wherein said first rate, said second rate, said third rate and said fourth rate have unequal values in each cycle of said sequence, wherein said sequence is followed for all values of said regulated output voltage from a lower threshold to higher threshold, wherein said higher threshold has a value greater than a voltage of said power source, wherein said lower threshold is close to zero voltage having a magnitude less than one percentage of magnitude of said higher threshold.

18. The article of manufacture of claim 17, wherein said DC-DC converter further comprises:

a capacitor coupled between said output node and a constant reference potential;

a first switch, wherein a first terminal of said first switch is coupled to unregulated power source, wherein a second terminal of said first switch is coupled to a first terminal of said inductor;

a second switch, wherein a first terminal of said second switch is coupled to said first terminal of said inductor, wherein a second terminal of said second switch is coupled to said constant reference potential;

a third switch wherein a first terminal of said third switch is coupled to a second terminal of said inductor, wherein a second terminal of said third switch is coupled to said constant reference potential; and a fourth switch, wherein a first terminal of said fourth switch is coupled to said second terminal of said inductor, wherein a second terminal of said fourth switch is coupled to said output node, wherein said control block:

closes each of said first switch and said third switch, as well as opens each of said second switch and said fourth switch, in said first interval to cause said increase;

closes each of said first switch and said fourth switch, as well as opens each of said second switch and said third switch, in said second interval to cause either said or raise or said lowering;

closes each of said second switch and said fourth switch, as well as opens each of said first switch and said third switch, in a third interval to cause said decrease; and repeats said sequence comprising said first interval, said second interval and said third interval to cause a next instance of said first interval to immediately follow an immediately previous instance of said third interval.

19. The article of manufacture of claim 18, wherein said regulated DC voltage is designed to always exceed by a headroom value, the instantaneous magnitude of said power-amplified output signal,
- wherein said higher threshold equals a maximum voltage that is supported by the manufacturing technique employed to manufacture said DC-DC converter.

20. The article of manufacture of claim 19, wherein said control block comprises:
- a comparator and a current-measurement circuit to generate a binary signal indicating that a next switching cycle is to commence;
- an extender block to generate an extended version of said binary signal, wherein said extended version controls operation of said first switch;
- a first inverter to generate the logical inverse of said extended version, wherein said logical inverse of said extended version controls operation of said second switch; and
- a second inverter to generate the logical inverse of said binary signal, wherein said logical inverse of said binary signal controls operation of said fourth switch,
- wherein said binary signal controls operation of said third switch,
- wherein said article of manufacture is a class-L amplifier.

* * * * *